(12) United States Patent
Chen

(10) Patent No.: US 7,271,627 B2
(45) Date of Patent: Sep. 18, 2007

(54) HIGH VOLTAGE TOLERANT INPUT BUFFER OPERABLE IN UNDER-DRIVE CONDITIONS

(75) Inventor: Kuo-Ji Chen, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 39 days.

(21) Appl. No.: 11/236,153

(22) Filed: Sep. 26, 2005

(65) Prior Publication Data
US 2007/0069770 A1    Mar. 29, 2007

(51) Int. Cl.
*H03K 3/00* (2006.01)
(52) U.S. Cl. ....................... 327/108; 327/379
(58) Field of Classification Search ................ 327/108, 327/365, 379
See application file for complete search history.

(56) References Cited

U.S. PATENT DOCUMENTS 5,726,944 A    3/1998  Pelley, III et al. .......... 365/226
5,801,563 A *  9/1998  McClure ..................... 327/170

* cited by examiner

*Primary Examiner*—Kenneth B. Wells
(74) *Attorney, Agent, or Firm*—Kirkpatrick & Ellis Preston Gates Ellis LLP

(57) ABSTRACT

An input buffer includes a signal passing module for generating a first output signal in response to the input signal based on a comparison between the input signal and a first supply voltage thereof; a regulating module having a first input terminal receiving the input signal and a second input terminal receiving the first output signal for generating a second output signal within a first predetermined voltage range; and a level down module for generating a third output signal within a second predetermined voltage range for the core circuitry in response to the second output signal. The input signal passes through the signal passing module with a substantial voltage drop when a voltage level of the input signal is substantially greater than the first supply voltage, and without a substantial voltage drop when the voltage level of the same is less than or equal to the first supply voltage.

12 Claims, 3 Drawing Sheets

HIGH VOLTAGE TOLERANT INPUT BUFFER OPERABLE IN UNDER-DRIVE CONDITIONS

BACKGROUND

The present invention relates generally to integrated circuit (IC) designs, and more particularly to a high voltage tolerant input buffer that is operable in under-drive conditions.

An IC includes a number of input pads, which may be used for receiving external signals. Each input pad is typically connected to a corresponding input buffer. An incoming signal must pass through the input buffer before entering core circuitries within the IC.

A conventional high voltage tolerant input buffer typically includes an NMOS pass-gate transistor, an input regulating module, a level down module, and some kind of electrostatic discharge (ESD) protection module. The NMOS pass-gate transistor is implemented to protect the input regulating module when the voltage at an input pad becomes too high. Since the voltage level of the output signals generated by the input regulating module is often higher than the voltage level at which the core circuitries operate, the level down module is implemented to convert the output signals from a higher voltage level to a lower voltage level before passing them on to the core circuitries.

However, the conventional high voltage tolerant input buffer may fail in under-drive conditions where the supply voltage of the buffer drops below a predetermined voltage level (e.g. 1.8 volts). When such under-drive condition occurs, the MOS transistors within the input regulating module may not be fully turned on as they were supposed to be. As such, the input regulating module may not operate properly.

Therefore, it is desirable to have a high voltage tolerant input buffer that can operate properly in under-drive conditions.

SUMMARY

The present invention discloses an input buffer for buffering an input signal sent to a core circuitry from outside of an integrated circuit. In one embodiment of the invention, the input buffer includes a signal passing module for generating a first output signal in response to the input signal based on a comparison between the input signal and a first supply voltage thereof; a regulating module having a first input terminal receiving the input signal and a second input terminal receiving the first output signal for generating a second output signal within a voltage range no greater than the first supply voltage; and a level down module for generating a third output signal within a voltage range no greater than a second supply voltage, which is lower than the first supply voltage, for the core circuitry in response to the second output signal. The input signal passes through the signal passing module with a substantial voltage drop when a voltage level of the input signal is substantially greater than the first supply voltage, and without a substantial voltage drop when the voltage level of the same is less than or equal to the first supply voltage.

For generating an output signal within a predetermined voltage range in response to an input signal; an NMOS transistor coupled between at least one input terminal of the regulating module and the input signal, having its gate connected to a supply voltage for reducing a voltage level of the input signal passed thereacross to the input terminal; and a PMOS transistor having its source and drain connected to a drain and source of the NMOS transistor, respectively, for selectively passing the input signal thereacross to the input terminal without substantially reducing the voltage level thereof when the voltage level of the input signal is less than or equal to the supply voltage.

The construction and method of operation of the invention, however, together with additional objectives and advantages thereof will be best understood from the following description of specific embodiments when read in connection with the accompanying drawings.

DESCRIPTION

Figure 1:
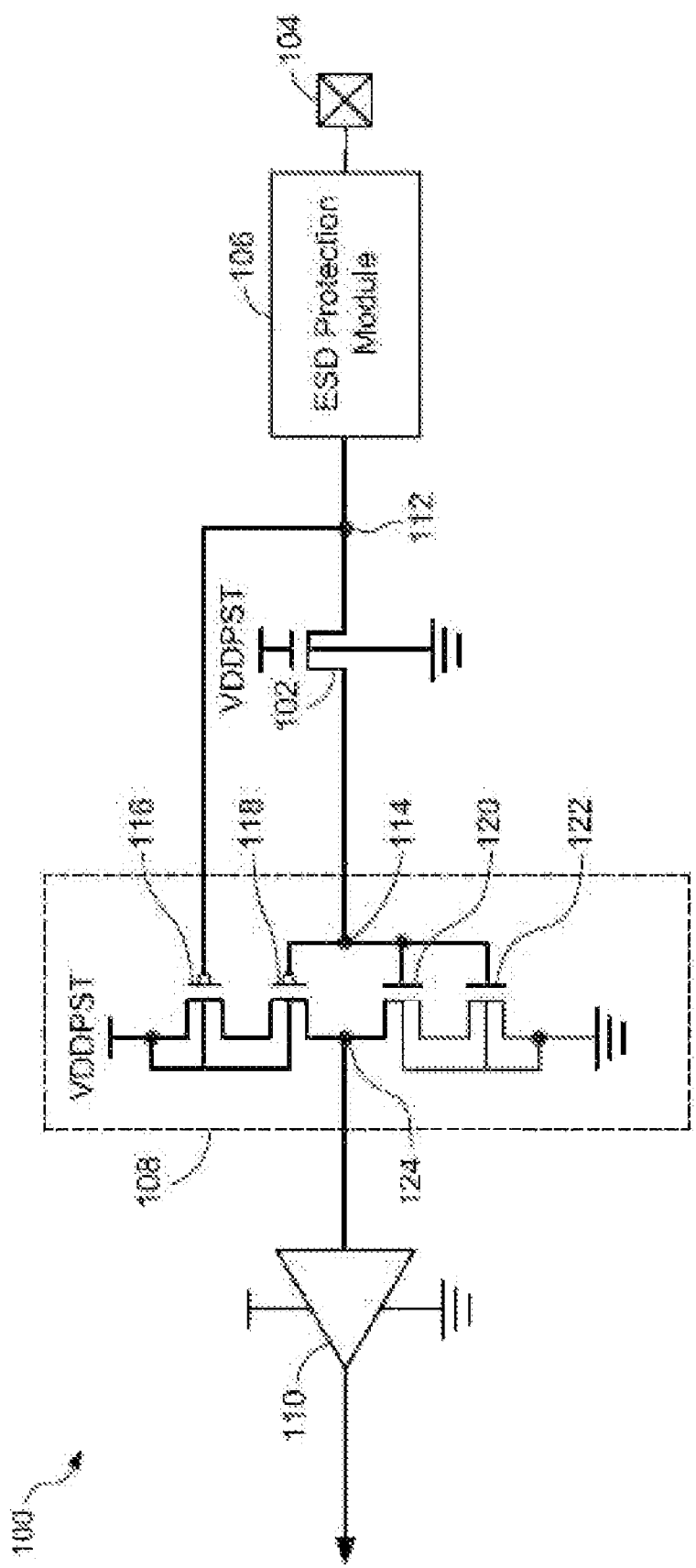
FIG. 1 illustrates a conventional high voltage tolerant input buffer.

FIG. 1 illustrates a conventional high voltage tolerant input buffer 100. An electrostatic discharge (ESD) protection module 106 is implemented between an input pad 104 and an NMOS pass-gate transistor 102 for protecting the input buffer 100 against an ESD current. The input buffer 100 includes an input regulating module 108 and a level down module 110. The input regulating module 108 has two input terminals: one connected to a node 112 between the ESD protection module 106 and the NMOS pass-gate transistor 102 and another input terminal coupled directly to the source of the NMOS pass-gate transistor 102 at a node 114. The input regulating module 108 includes two PMOS transistors 116 and 118 and two NMOS transistors 120 and 122. The two PMOS transistors 116 and 118 are placed in a cascode configuration between the voltage supply VDDPST and a node 124, which is further coupled to the level down module 110. The gate of the PMOS transistor 116 representing one input terminal is tied to the node 112 while the gate of the PMOS transistor 118 is coupled to the other input terminal at the node 114. Two NMOS transistors 120 and 122 are also placed in a cascode configuration between the node 124 and a complementary supply voltage, such as ground or VSSPST. The output signals of the input regulating module 108 at the node 124 can be brought down to a core voltage level, such as VDD, by the level down module 110 before outputting to the core circuitries (not shown in the figure).

To protect the gates of the NMOS transistors 120 and 122 from high voltage stress, the NMOS pass-gate transistor 102 is implemented between the nodes 112 and 114 for reducing the voltage level of an input signal passed thereacross. The NMOS pass-gate transistor 102 has its gate connected to the supply voltage VDDPST. This ensures that the bias applied to the gates of the NMOS transistors 120 and 122 would not exceed VDDPST−Vtn, where Vtn is the threshold voltage of the NMOS transistor 102, thereby protecting them from high voltage stress.

The conventional high voltage tolerant input buffer 100 may fail in under-drive conditions, which are referred to a situation in which the supply voltage VDDPST is dropped to a level substantially lower than its normal operation level. For example, when the supply voltage VDDPST is lowered to about twice as much as the threshold voltage Vtn of the NMOS pass gate transistor 102, the voltage Vin at the node 114 would become about one Vtn (VDDPST−Vtn). If the NMOS transistors 120 and 122 also have a threshold voltage equal to Vtn, the voltage Vin will not be sufficient to turn on these transistors, thereby causing the input regulating module 108 to fail.

Figure 2A:
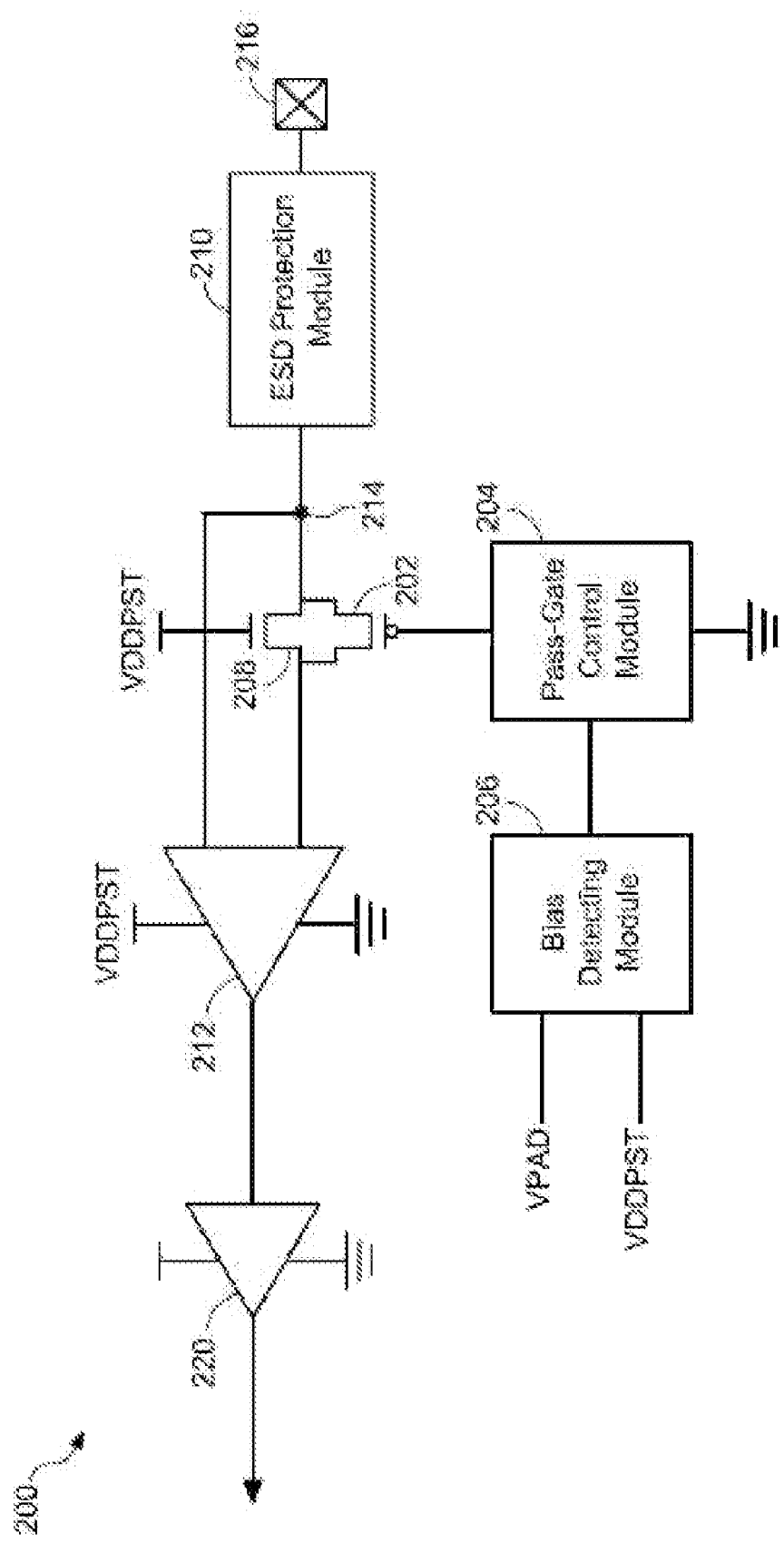
FIG. 2A schematically illustrates a high voltage tolerant input buffer in accordance with one embodiment of the present invention.

FIG. 2A schematically illustrates a high voltage tolerant input buffer 200 in accordance with one embodiment of the present invention. A PMOS pass-gate transistor 202 is implemented in parallel with an NMOS pass-gate transistor 208 where the source of the PMOS transistor 202 is connected to the drain of the NMOS transistor 208 and the drain of the PMOS transistor 202 is connected to the source of the NMOS transistor 208. The PMOS pass-gate transistor 202 has its source coupled to an ESD protection module 210 and an input terminal of an input regulating module 212 through a node 214, while with its drain tied to the other input terminal thereof. The output of the input regulating module 212 is tied to a level down module 220. The gate of the PMOS pass-gate transistor 202 is coupled to and controlled by the pass-gate control module 204. The pass-gate control module 204 generates a control signal to the gate of the PMOS pass-gate transistor 202 in response to a detection signal received from a bias detecting module 206. It is noted that the NMOS transistor 208, the PMOS transistor 202, pass-gate control module 204 and the bias detecting module 206 can be collectively referred to as a signal passing module.

The bias detecting module 206 compares the input signal received from an input pad 216 (VPAD) with the supply voltage VDDPST to produce the detection signal. The control signal generated by the pass-gate control module 204 is responsive to the detection signal. The control signal is at a low level, such as 0 volt, to turn on the PMOS pass-gate transistor 202 when VPAD is equal to or less than VDDPST, while it is at a high level, such as VPAD, to turn off the same when VPAD is substantially greater than VDDPST. When the PMOS pass-gate transistor 202 is turned off, the voltage level of the signal passed through the NMOS pass-gate transistor 208 is reduced, thereby protecting the input regulating module 212 from high voltage stress. When the PMOS pass-gate transistor 202 is turned on, a signal is able to pass therethrough without a substantial voltage drop. This helps to provide a signal of sufficient voltage for the input regulating module 212 to operate properly even in the under-drive conditions.

Figure 2B:
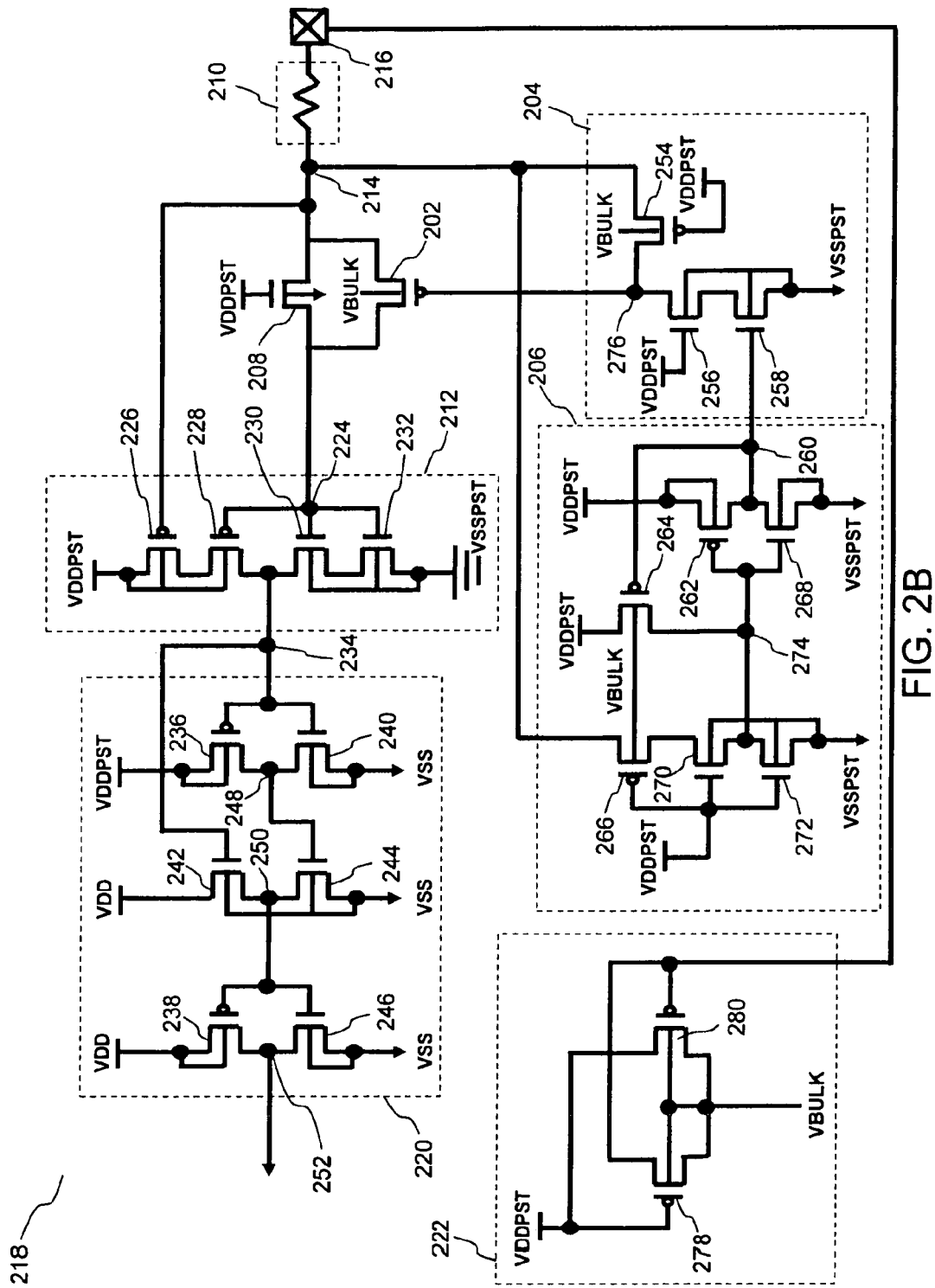
FIG. 2B schematically illustrates the high voltage tolerant input buffer in further detail according to one embodiment of the present invention.

FIG. 2B schematically illustrates the high voltage tolerant input buffer 218 in further detail according to one embodiment of the present invention. The high voltage tolerant input buffer 218, which connects to an input pad 216, includes the NMOS pass-gate transistor 208, the PMOS pass-gate transistor 202, the ESD protection module 210, the pass-gate control module 204, the bias detecting module 206, the input regulating module 212, and the level down module 220. An additional dynamic well control module 222 that is coupled with various parts of the high voltage tolerant input buffer 218 is also shown. As explained above, the PMOS pass-gate transistor 202 is implemented in parallel with the NMOS pass-gate transistor 208. The bias detection module 206 and the pass-gate control module 204 are implemented to control the PMOS pass-gate transistor 202 by supplying its gate with a control signal.

When the high voltage tolerant input buffer 218 operates in normal conditions and the voltage level at the input pad 216 VPAD is substantially higher than the supply voltage VDDPST, this system operates much like the conventional high voltage tolerant input buffer 100 shown in FIG. 1. The NMOS pass-gate transistor 208 is still used for protecting the input regulating module 212 when VPAD reaches a level higher than VDDPST. The ESD protection module 110, which is shown to be a resistor in this embodiment, is implemented between the input pad 216 and the NMOS pass-gate transistor 208 for protecting the input buffer 218 against an ESD current. The input regulating module 212 has two input terminals: one connected to the node 214 between the ESD protection module 210 and the NMOS pass-gate transistor 208 while another input terminal is coupled directly to the source of the NMOS pass-gate transistor 208 at a node 224. The input regulating module 212 includes two PMOS transistors 226 and 228 and two NMOS transistors 230 and 232. The two PMOS transistors 226 and 228 are placed in a cascode configuration between the supply voltage VDDPST and a node 234. The gate of the PMOS transistor 226 representing one of the input terminals of the input regulating module 212 is tied to the node 214, while the gate of the PMOS transistor 228 is coupled to the other input terminal at the node 224. The two NMOS transistors 230 and 232 are also placed in a cascode configuration between the node 234 and a complementary supply voltage, such as ground, VSSPST, or VSS. Both gates of the NMOS transistors 230 and 232 are coupled to the node 224. The output of the input regulating module 212 at the node 234 can be brought down to a core voltage level VDD by the level down module 220 before entering the core circuitries (not shown). The level down module 220 includes two PMOS transistors 236 and 238 and four NMOS transistors 240, 242, 244, and 246. Out of the six transistors, only the PMOS transistor 236 and the NMOS transistor 240 are supplied by the high supply voltage VDDPST. The level down module 220 is designed to invert and convert the output at the node 234 from a high level supply voltage signal to a low level core voltage signal. For example, when a low signal is at the node 234, the NMOS transistors 240 and 242 are turned off while the PMOS transistor 236 is turned on to allow the supply voltage VDDPST to reach a node 248. This turns on the NMOS transistor 244, thereby pulling a node 250 low to VSS. Therefore, after the NMOS transistor 246 is turned off, and the PMOS transistor 238 is turned on, a node 252 is brought up to core supply voltage VDD. When a high signal is at the node 234, the NMOS transistor 242 will be turned on, pulling the node 250 high to core supply voltage VDD. This turns off the PMOS transistor 238 and turns on the NMOS transistor 246, thereby pulling the node 252 low to VSS.

In order for the high voltage tolerant input buffer 218 to function properly in under-drive conditions, the PMOS pass-gate transistor 202 is implemented in parallel with the NMOS pass-gate transistor 208 between the ESD protection module 210 and the input regulating module 212. The gate of the PMOS pass-gate transistor 202 is coupled to the pass-gate control module 204. The pass-gate control module 204 provides the gate of the PMOS pass-gate transistor 202 with a control signal for controlling the PMOS pass-gate transistor 202. The control signal generated by the pass-gate control module 204 is based on two key conditions. The control signal should be at a low level, such as 0 volt, during normal operation of the input buffer 218 when the supply voltage VDDPST is equal to or greater than VPAD, while the control signal is equal to VPAD when VPAD is substantially higher than VDDPST. This also means that the PMOS pass-gate transistor 202 is turned off when VPAD exceeds the supply voltage VDDPST, and the PMOS pass-gate transistor 202 is turned on when VPAD is less than or equal to the supply voltage VDDPST. The pass-gate control module 204 includes a PMOS transistor 254 and two NMOS transistors 256 and 258. The gate of the PMOS transistor 254 and the NMOS transistor 256 are both tied to the supply voltage VDDPST such that the PMOS transistor 254 and the NMOS transistor 256 are turned on or off based on the supply voltage VDDPST and VPAD. For example, when VAPD exceeds the supply voltage VDDPST, the PMOS transistor 254 is turned on to allow VPAD from the node 214 to reach the gate of the PMOS pass-gate transistor 202, thereby turning it off. With the NMOS transistor 256 designed to be turned on at all time, in order to keep the PMOS pass-gate transistor 202 at an off-state during this condition, the bias detecting module 206 will provide a low level detection signal at a node 260 to turn off the NMOS transistor 258.

The bias detecting module 206 compares VDDPST and VPAD. The bias detecting module 206 includes three PMOS transistors 262, 264, and 266 and three NMOS transistors 268, 270, and 272. The PMOS transistor 262 and the NMOS transistor 268 together form an inverter, while the PMOS transistors 264 and 266, and the NMOS transistor 270 together form a loop to create a hystereses buffer. The output of this hystereses buffer is provided at a node 274, which is also the input of the inverter formed by the PMOS transistor 262 and the NMOS transistor 268. The PMOS transistor 264, which may be seen as a bias transistor, is biased by the voltage level at the node 260, and the node 274 can be pulled up according to this bias voltage at the node 260. The gates of the PMOS transistor 266, the NMOS transistor 270, and the NMOS transistor 272 are all coupled to VDDPST. The NMOS transistors 270 and 272 are at an on-state when VPAD is less than or equal to VDDPST. The PMOS transistor 266 is used to compare the voltage level at the node 214 with the supply voltage VDDPST. Note that the voltage level at the node 214 is approximately equal to VPAD. If VPAD is higher than the supply voltage VDDPST, the PMOS transistor 266 will be turned on to pull the node 274 high resulting in a low signal at the node 260 after the inverter turns off the NMOS transistor 258. This allows a node 276 to have a voltage level equal to the voltage level at the node 214 since the PMOS transistor 254 will be turned on. If VPAD is less than or equal to the voltage at the high supply voltage VDDPST, the PMOS transistor 266 will be turned off to keep the node 274 low such that a high signal appearing at the node 260 turns on the NMOS transistor 258. Meanwhile, the PMOS transistor 254 will also be turned off due to this condition where the voltage level at the input pad 216 is less than or equal to the voltage at the high supply voltage VDDPST. This allows the node 276 to be pulled low, thus turning on the PMOS pass-gate transistor 202.

The dynamic well control module 222, including two PMOS transistors 278 and 280, is implemented to adjust the voltage at the bulk of the PMOS transistors 202, 254, 264 and 266 as the voltage levels at the input pad 216 VPAD and the supply voltage VDDPST change. The two PMOS transistors 278 and 280 compare the voltage levels at the input pad 216 and at the high supply voltage VDDPST. When the voltage at the input pad 216 is higher, the voltage at the bulk (VBULK) of the PMOS transistors 202, 254, 264, and 266 are switched to the voltage level of the input pad 216. When the voltage at the high supply voltage VDDPST is higher than or equal to the voltage level of the input pad 216, the voltage at the bulk of the PMOS transistors 202, 254, 264, and 266 are switched to the voltage level of the high supply voltage VDDPST. By adjusting the voltage level at the bulk of the PMOS transistors 202, 254, 264, and 266, latch-up or leakage issues can be prevented.

The pass-gate control module 204 and the bias detecting module 206 together control the on and off states of the PMOS pass-gate transistor 202, which allows the input regulating module to operate properly in under-drive conditions. For example, during an under-drive condition, VDDPST is at 1.8 volts as opposed to its normal operation voltage level 3.3 volts. When VPAD is equal to or less than 1.8 volts, the control signal at the node 276 will be at a low level, such as zero volt, and turn on the PMOS pass-gate transistor 202. Thus, VPAD will be able to pass through the PMOS pass-gate transistor 202 to the node 224 without suffering from a substantial voltage drop. As such, the voltage level at the node 224 would be about 1.8 volts, which is sufficient to turn on the NMOS transistors 230 and 232 whose threshold voltages are approximately equal to 0.7 volt.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An input buffer for buffering an input signal sent to a core circuitry from outside of an integrated circuit, comprising:
   a signal passing module for generating a first output signal in response to the input signal based on a comparison between the input signal and a first supply voltage thereof;
   a regulating module having a first input terminal receiving the input signal and a second input terminal receiving the first output signal for generating a second output signal within a voltage range no greater than the first supply voltage; and
   a level down module for generating a third output signal within a voltage range no greater than a second supply voltage, which is lower than the first supply voltage, for the core circuitry in response to the second output signal,
   wherein the signal passing module comprises a first NMOS transistor coupled between the second input terminal of the regulating module and the input signal, having its gate connected to the first supply voltage, a first PMOS transistor having its source and drain connected to a drain and source of the first NMOS transistor, respectively, and a control module for generating a control signal to a gate of the first PMOS transistor, the control signal turning on the first PMOS transistor when a voltage level of the input signal is equal to or less than the first supply voltage, while turning off the same when the voltage level of the input signal is greater than the first supply voltage.

2. The input buffer of claim 1 wherein the control module further comprises a second PMOS transistor having a gate connected to the first supply voltage, a source connected to the input signal, and a drain connected to the gate of the first PMOS transistor.

3. The input buffer of claim 2 wherein the control module further comprises second and third NMOS transistors serially coupled between the gate of the first PMOS transistor and a complementary supply voltage, the second NMOS transistor having a gate connected to the first supply voltage.

4. The input buffer of claim 3 wherein the signal passing module further comprises a detecting module coupled to the control module for applying a detection signal to a gate of the third NMOS transistor based on a comparison between the input signal and the first supply voltage.

5. The input buffer of claim 4 wherein the detecting module further comprises a third PMOS transistor having a source connected to the input signal and a gate connected to the first supply voltage.

6. The input buffer of claim 5 wherein the detecting module further comprises fourth and fifth NMOS transistors serially coupled between a drain of the third PMOS transistor and the complementary supply voltage, the fourth and fifth NMOS transistors having their gates connected to the first supply voltage.

7. The input buffer of claim 6 wherein the detecting module further comprises a fourth PMOS transistor coupled between the first supply voltage and a node between the fourth and fifth NMOS transistors, the fourth PMOS transistor having its gate connected to the gate of the third NMOS transistor.

8. The input buffer of claim 7 wherein the detecting module further comprises a fifth PMOS transistor having a source coupled to the first supply voltage, a gate connected to a drain of the fourth PMOS transistor, and a drain connected to the gate of the third NMOS transistor for generating the detection signal having a voltage level of the first supply voltage to the gate of the third NMOS transistor when the voltage level of the input signal is equal to or less than the first supply voltage.

9. The input buffer of claim 8 wherein the detecting module further comprises a sixth NMOS transistor having a drain connected to the gate of the third NMOS transistor, a source coupled to the complementary supply voltage and a gate connected to the drain of the fourth PMOS transistor, for generating the detection signal pulling the gate of the third NMOS transistor to the complementary supply voltage when the voltage level of the input signal is substantially greater than the first supply voltage.

10. An input buffer for an integrated circuit, comprising:
a regulating module for generating an output signal within a predetermined voltage range in response to an input signal;
a first NMOS transistor coupled between an input terminal of the regulating module and the input signal, having its gate connected to a supply voltage for reducing a voltage level of the input signal passed thereacross to the input terminal;
a first PMOS transistor having its source and drain connected to a drain and source of the first NMOS transistor, respectively, for selectively passing the input signal thereacross to the input terminal without substantially reducing the voltage level thereof;
a control module for outputting a control signal to a gate of the first PMOS transistor; and
a detecting module coupled to the control module for outputting a detection signal thereto based on a comparison between the input signal and the supply voltage,
wherein the control signal turns on the first PMOS transistor when the voltage level of the input signal is equal to or less than the supply voltage, while turns off the same when the voltage level of the input signal is substantially greater than the supply voltage, in response to the detection signal.

11. The input buffer of claim 10 wherein the control module further comprises a second PMOS transistor having a gate connected to the supply voltage, a source connected to the input signal, and a drain connected to the gate of the first PMOS transistor.

12. The input buffer of claim 11 wherein the control module further comprises second and third NMOS transistors serially coupled between the gate of the first PMOS transistor and a complementary supply voltage, the second NMOS transistor having a gate connected to the supply voltage and the third NMOS transistor having a gate connected to the detection signal.

* * * * *